(12) United States Patent
Yamauchi

(10) Patent No.: US 6,648,045 B2
(45) Date of Patent: Nov. 18, 2003

(54) CHIP BONDING APPARATUS

(75) Inventor: Akira Yamauchi, Otsu (JP)

(73) Assignee: Toray Engineering Co., Ltd., Osaka (JP)

( * ) Notice: Subject to any disclaimer, the term of this patent is extended or adjusted under 35 U.S.C. 154(b) by 0 days.

(21) Appl. No.: 10/148,444

(22) PCT Filed: Nov. 30, 2000

(86) PCT No.: PCT/JP00/08448

§ 371 (c)(1),
(2), (4) Date: May 30, 2002

(87) PCT Pub. No.: WO01/41209

PCT Pub. Date: Jun. 7, 2001

(65) Prior Publication Data

US 2002/0189767 A1 Dec. 19, 2002

(30) Foreign Application Priority Data

Nov. 30, 1999 (JP) ............................................ 11-341089

(51) Int. Cl.[7] .............................................. B23K 37/04
(52) U.S. Cl. ...................................... 156/580; 228/44.7
(58) Field of Search ................................ 156/580, 581, 156/583.1; 228/44.3, 44.7, 49.5

(56) References Cited

U.S. PATENT DOCUMENTS 5,632,434 A * 5/1997 Evans et al. ................ 228/44.7
5,785,799 A * 7/1998 Culnane et al. ........... 156/379.7
6,347,655 B1 * 2/2002 Yamamoto et al. .......... 156/540
6,460,591 B1 * 10/2002 Gotoh et al. ................. 156/359

FOREIGN PATENT DOCUMENTS

| JP | 03-211849 | 9/1991 |
| JP | 04-017344 | 1/1992 |
| JP | 2000-068324 | 3/2000 |
| JP | 2000-353725 | 12/2000 |

OTHER PUBLICATIONS

International Search Report PCT/JP00/08448 mailed on Mar. 13, 2001.

* cited by examiner

Primary Examiner—James Sells
(74) Attorney, Agent, or Firm—Rader, Fishman & Grauer PLLC

(57) ABSTRACT

The present invention relates to a chip bonding apparatus for bonding a chip to a substrate, with a support structure for preventing a deviation or error in parallelism of a head 1 holding the chip. A first support mechanism 4 supports a pressure cylinder 3 for pressing the head 1 toward a substrate 2. A second support mechanism 5 is provided separately from and independently of the first support mechanism 4 for supporting a reactive force acting on the pressure cylinder 3 when the head 1 is pressed toward the substrate 2. The second support mechanism 5 is in contact with the pressure cylinder 3 through a spherical point of contact 12.

10 Claims, 3 Drawing Sheets

CHIP BONDING APPARATUS

TECHNICAL FIELD

This invention relates to a chip bonding apparatus for bonding a chip such as a semiconductor device on a substrate, and more particularly to a support structure for supporting a tool (hereinafter called "head") that holds the chip and press-fits it on the substrate.

BACKGROUND ART

As one of typical techniques for installing a chip directly on a substrate, the ACF (Anisotropic Conductive Film) technique is known. This technique uses ACF having conductive particles mixed into an adhesive to secure the chip on the substrate. The chip is installed on the ACF applied to the substrate, thereby bonding the chip to the substrate, and at the same time electrically connecting the chip and substrate by the conductive particles placed between upper and lower electrodes. In the ACF technique, a polyester film coated with an adhesive is supplied from an ACF tape feeder, and, while peeling off a separator, the adhesive layer is scored, and heated and pressed by a heat tool from above, whereby the ACF is transferred to the substrate. Next, when the chip held by the head is press-fitted to the ACF from above, bumps of the chip and electrodes of the substrate become conductive through the conductive particles in the adhesive. The chip is heated and pressurized in time of press-fitting, whereby the adhesive (binder) cures to bond the chip and substrate in a conductive state.

A conventional chip bonding apparatus used in a process of press-fitting a chip on a substrate will be described hereinafter with reference to the drawings. FIG. 1 shows an outline of a conventional chip bonding apparatus.

The conventional chip bonding apparatus has a pressure cylinder 3 attached to an inversed L-shape head mounting post 15 for pressing a head 1 holding a chip toward a substrate 2. The pressure cylinder 3 has a rod 3a supported in an intermediate portion thereof by the head mounting post 15 through a slide unit 16. The head 1 is attached to the lower end of the rod 3a of the pressure cylinder 3. There is a table 6 below the head 1. The table 6 holds thereon the substrate 2 which has ACF transferred thereto. The chip, not shown, is held on the lower surface of the head 1. The rod 3a of pressure cylinder 3 is extendible in this state to press-fit the chip on the substrate 2.

In the conventional chip bonding apparatus, as noted above, the pressure cylinder 3, slide unit 16 and head 1 are integrated with the head mounting post 15. When the head 1 presses the chip on the substrate 2, a reaction thereof pushes up a horizontal portion of the head mounting post 15 supporting the pressure cylinder 3 to apply a bending moment to the head mounting post 15, to bend or warp the head mounting post 15. This results in a deviation or error in parallelism in the order of several microns occurring between the head 1 and table 6.

The deviation or error in parallelism between the head 1 and table 6 causes the following inconvenience. That is, as shown in FIG. 2, a bump 23 on the chip 22 and an electrode 24 on the substrate 2 opposed to each other across a conductive particle 21 in the ACF rub against each other (i.e. shift in a horizontal plane relative to each other). This causes the conductive particle 21 between the bump 23 and electrode 24 to roll though slightly, thereby to create an oval spread space between the bump 23 and electrode 24. As a result, the area of contact between the conductive particle 21 and bump 23 or the conductive particle 21 and electrode 24 diminishes to increase conduction resistance or cause variations thereof. As a solution to this, it is conceivable to increase rigidity of the head mounting post 15, but there is a limitation.

Particularly, as a recent tendency, from a viewpoint such as of shortening the processing time of a press-fitting step, apparatus have been proposed and implemented to press-fit chips simultaneously by using two or more heads. In such a multi-head apparatus, the above problem becomes even more prominent.

The present invention has been made having regard to the state of the art noted above, and its object is to prevent a deviation or error in parallelism occurring with a head when press-fitting a chip.

DISCLOSURE OF THE INVENTION

The present invention provides a chip bonding apparatus for press-fitting a chip on a substrate, characterized by comprising a head for holding the chip, a pressure cylinder for pressing said head toward the substrate, a first support mechanism for supporting said pressure cylinder to be movable up and down, and a second support mechanism separate from and independent of said first support mechanism for supporting a reactive force acting on said pressure cylinder when said head is pressed toward the substrate.

According to the present invention, since the pressure cylinder is supported by the first support mechanism to be movable up and down, when a reactive force acts on the pressure cylinder in time of chip press-fitting, the reactive force is borne by the second support mechanism. Since this second support mechanism is separate from and independent of the first support mechanism, even when the second support mechanism bends or warps under said reactive force, its influence is not transmitted to the first support mechanism. That is, since the first support mechanism supporting the pressure cylinder does not bend or warp, the head is free from a deviation or error in parallelism in time of press-fitting.

Preferably, the second support mechanism supports the reactive force acting on the pressure cylinder, by contacting the pressure cylinder. With this construction, since not only the first support mechanism but also the pressure cylinder is free from the influence of the bending or warping of the second support mechanism, the deviation or error in parallelism of the head may be further suppressed in time of press-fitting.

The contact structure between the second support mechanism and pressure cylinder may be either direct contact or indirect contact. From the viewpoint of reducing frictional resistance, the contact structure, preferably, is a point contact such as a spherical point of contact, for example.

The present invention is applicable to both an apparatus having one set of head and pressure cylinder, and an apparatus having plural sets of head and pressure cylinder. In the apparatus having plural sets of head and pressure cylinder also, the first support mechanism for supporting each pressure cylinder to be movable up and down and the second support mechanism for supporting a reactive force acting on each pressure cylinder are constructed separate from and independent of each other.

BEST MODE FOR CARRYING OUT THE INVENTION

Preferred embodiments of the present invention will be described hereinafter with reference to the drawings.

(First Embodiment)

Figure 3:
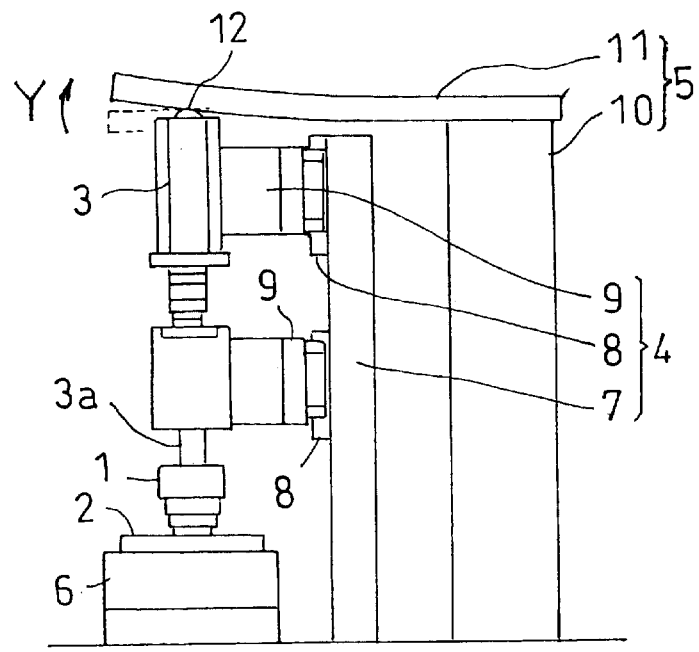
FIG. 3 is a view showing an outline of a chip bonding apparatus in a first embodiment of the present invention.

FIG. 3 is a view showing an outline of a chip bonding apparatus in a first embodiment of the present invention.

The apparatus in this embodiment includes a head 1 for holding a chip (not shown) on a lower surface thereof, a pressure cylinder 3 for pressing this head 1 toward a substrate 2, a first support mechanism 4 for supporting this pressure cylinder 3 to be movable up and down, and a second support mechanism 5 separate from and independent of the first support mechanism 4 for supporting a reactive force acting on the pressure cylinder 3 when the head 1 is pressed toward the substrate 2.

The substrate 2 is held on a table 6. The substrate 2 has ACF (Anisotropic Conductive Film) transferred to a bonding location thereof beforehand.

The head 1 holds the chip on the lower surface thereof by means of an appropriate holding mechanism such as a suction mechanism or mechanical pawls. The head 1 is connected to the lower end of a rod 3a projecting from the pressure cylinder 3.

The first support mechanism 4 includes a fixed head mounting post 7, a guide rail 8 disposed to extend vertically on this head mounting post 7, and a movable member 9 slidably engaged with this guide rail 8 and connected to the pressure cylinder 3. The rod 3a also is supported in an intermediate position thereof by a similar guide rail 8 and movable member 9.

The second support mechanism 5 includes a fixed frame 10, and a reactive force receiving member 11 connected to this frame 10. This reactive force receiving member 11 contacts the top of pressure cylinder 3 to support the reactive force acting on the pressure cylinder 3. The top of pressure cylinder 3 defines a spherical point of contact 12. Through this point of contact 12 the reactive force receiving member 11 supports, by point contact, the reactive force acting on the pressure cylinder 3.

In the apparatus of the embodiment having the above construction, when the head 1 presses the chip on the substrate 2 on the table 6 based on an operation of the pressure cylinder 3, the reactive force acting on the pressure cylinder 3 is transmitted to the reactive force receiving member 11 integral with the frame 10. The first support mechanism 4 consisting of the frame 10 and reactive force receiving member 11 bends or warps under a moment based on the upward pushing force.

However, in this embodiment, the second support mechanism 5 supporting the pressure cylinder 3 is constructed separate from and independent of the first support mechanism 4 not to receive the influence of the upward pushing force applied to the first support mechanism 4. To absorb a jogging of bending or warping of the frame 10 and reactive force receiving member 11, the pressure cylinder 3 is vertically movably supported by the first support mechanism 4. Thus, although the second support mechanism 5 bends or warps under the upward pushing force received from the pressure cylinder 3, no bending or warping occurs with the first support mechanism 4. The head 1 descends vertically along the guide rails 8 to transmit an accurate contact pressure to the table 6.

Figure 1:
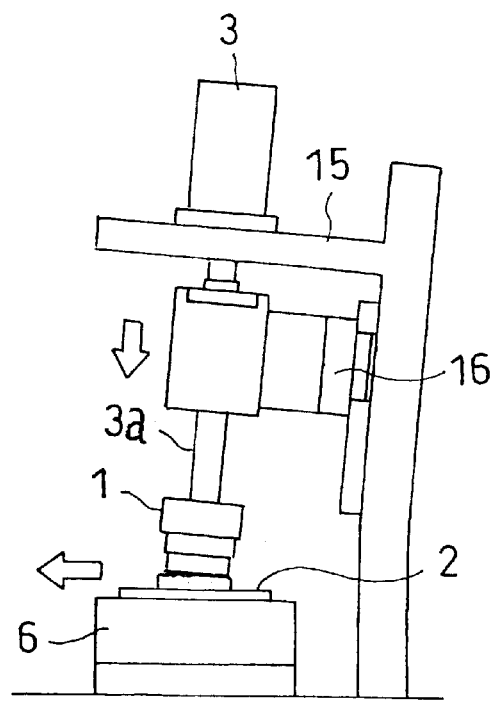
FIG. 1 is a view showing an outline of a conventional apparatus.
Figure 2:
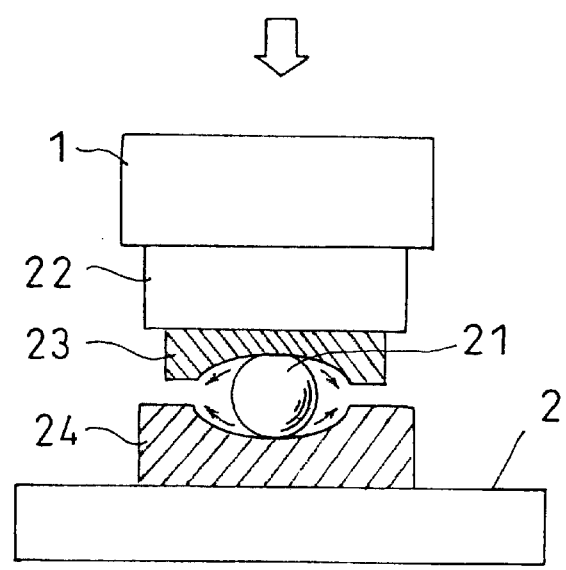
FIG. 2 is a sectional view showing a state of press-fitting by the conventional apparatus.

Further, when the pressure cylinder 3 operates to press the head 1 toward the substrate 2, its reactive force causes the frame 10 and reactive force receiving member 11 to bend or warp. Where the reactive force receiving member 11 and pressure cylinder 3 are fixedly interconnected as in the conventional apparatus shown in FIG. 1, the pressure cylinder 3 is influenced by the bending or warping of the reactive force receiving member 11 to apply a bending moment to the guide rails 8 inadvertently. Thus, a deviation or error in parallelism would occur between the head 1 and table 6. In this embodiment, to eliminate the influence of the bending moment, the spherical point of contact 12 is provided between the top of pressure cylinder 3 and the reactive force receiving member 11, whereby the reactive force receiving member 11 supports the reactive force from the pressure cylinder 3 by point contact. As a result, the first support mechanism 4 does not undergo any influences of the bending force, thereby to slide the head 1 in the vertical direction.

Figure 4:
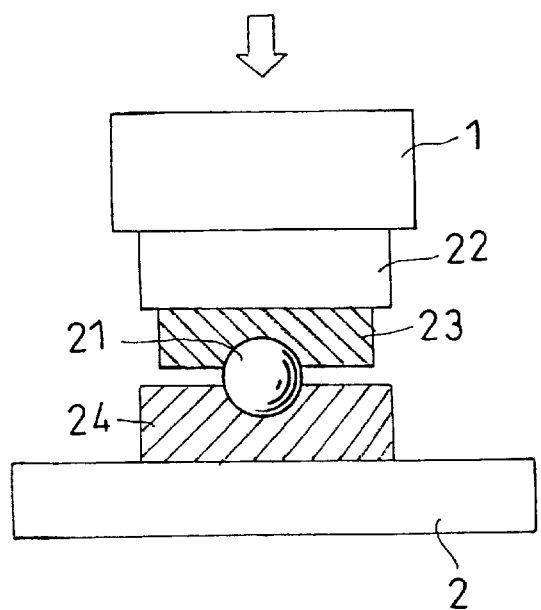
FIG. 4 is a sectional view showing a state of press-fitting by the apparatus in the embodiment.

Thus, a steady press-fitting is realized free of a deviation or error in parallelism in the order of several microns between the head 1 and table 6. As a result, as shown in FIG. 4, a bump 23 on the chip 22 and an electrode 24 on the substrate 2 opposed to each other across a conductive particle 21 in the ACF never rub against each other, but the conductive particle 21 is uniformly deformed to be fully embraced. This results in increased areas of contact between the bump 23/electrode 24 and the conductive particle 21 to reduce conduction resistance and reduce variations thereof also.

(Second Embodiment)

Figure 5:
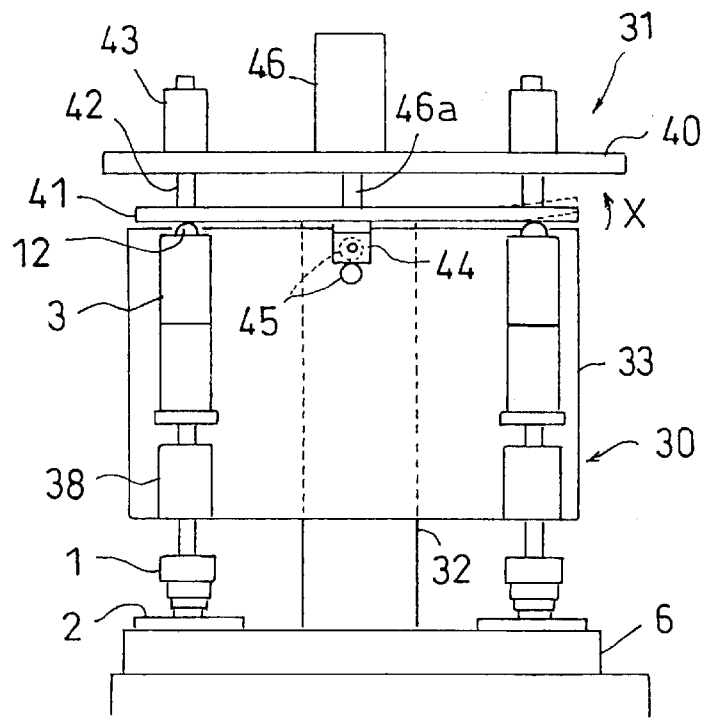
FIG. 5 is a front view of an apparatus in a second embodiment.
Figure 6:
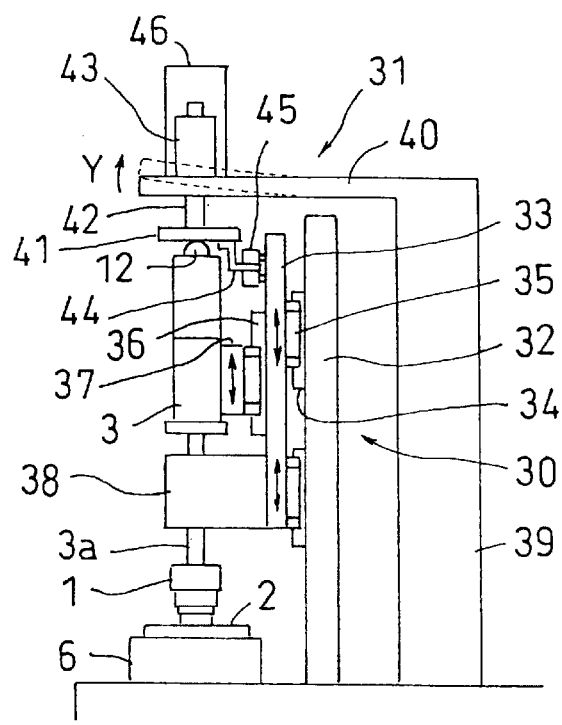
FIG. 6 is a side view of the apparatus in the second embodiment.

An apparatus in a second embodiment is a chip bonding apparatus of what is known as the multi-head type having two or more heads to perform a chip press-fitting operation efficiently. FIG. 5 is a front view of the chip bonding apparatus of the multi-head type in the second embodiment. FIG. 6 is a side view thereof.

This chip bonding apparatus includes a first support mechanism 30 for vertically movably supporting a plurality of pressure cylinders 3, a second support mechanism 31 separate from and independent of the first support mechanism 30 for supporting a reactive force acting on each pressure cylinder 3 when the heads 1 are simultaneously pressed toward substrates 2.

The first support mechanism 30 includes a fixed head mounting post 32, and a lift member 33 vertically movably attached to the head mounting post 32 for supporting the pressure cylinders 3 to be movable up and down. Specifically, the head mounting post 32 has guide rails 34 arranged thereon and extending vertically. Movable members 35 are slidably engaged with the guide rails 34, and these movable members 35 are connected to the lift member 33. The lift member 33 also has a plurality of guide rails 36 corresponding to the pressure cylinders 3. Movable members 37 are slidably engaged with the respective guide rails 36, and these movable members 37 are connected to the respective pressure cylinders 3. A rod 3a of each pressure cylinder 3 has an intermediate member guided by a guide member 38 erected on the lift member 33.

The second support mechanism 31 includes a fixed frame 39, a first reactive force receiving member 40 connected to this frame 39, and a second reactive force receiving member 41 vertically movably supported by the first reactive force receiving member 40, connected to the lift member 33 by point contact or line contact, and in contact with the plurality of pressure cylinders 3 disposed on the lift member 33. Specifically, guide posts 42 erected adjacent opposite ends of the second reactive force receiving member 41 are vertically guided by guide members 43 arranged on the first reactive force receiving member 40. The second reactive force receiving member 41 has an approximately L-shaped engaging piece 44 connected to a middle position on the lower surface thereof. This engaging piece 44 is pinched between a pair of rollers 45 rotatably attached to the lift member 33, whereby the second reactive force receiving member 41 is connected to the lift member 33 in a state of point contact or line contact. The first reactive force receiving member 40 has an actuator (drive means) 46 mounted thereon for raising and lowering the lift member 33 with each pressure cylinder 3. The actuator 46 has a drive shaft 46a connected to the second reactive force receiving member 41. An air cylinder or servo motor, for example, is used as the actuator 46.

Operation of the apparatus in the second embodiment will be described next.

In the initial state, the pressure cylinders 3 and the lift member 33 are in an upper limit position. Upon start of a chip installing operation, the actuator 46 is operated to lower the pressure cylinders 3 with the lift member 33. When the heads 1 are lowered to a predetermined height above the table 6, the descent by the actuator 46 is stopped. Subsequently, the pressure cylinders 3 are operated simultaneously to press the heads 1 toward the substrates, thereby press-fitting the chips on the respective substrates 2 simultaneously.

This embodiment is similar in principle to the case of one head described in the first embodiment, and the first support mechanism 30 for supporting the heads 1 and pressure cylinders 3, and the second support mechanism 31 for supporting a reactive force of each pressure cylinder 3, are separate from and independent of each other, to achieve the same advantage as in the first embodiment.

In the one-head type apparatus in the first embodiment, as shown in FIG. 3, only the bending in the Y-direction of the reactive force receiving member 11 may be considered. In the multi-head type apparatus as in the second embodiment, it is desirable to consider the bending in the X-direction (in the direction of head arrangement) as well. In the second embodiment, therefore, the second reactive force receiving member 41 slide-guided in the vertical direction by the first reactive force receiving member 40 is joined with the lift member 33 by point contact or line contact in the middle, and the lift member 33 is constructed movable up and down. As in the first embodiment, each pressure cylinder 3 and the second reactive force receiving member 41 contact each other through the spherical point of contact 12.

Thus, according to the second embodiment, a reactive force acting on each pressure cylinder 3 in time of press-fitting the chips, particularly a reactive force causing a bending in the Y-direction, is transmitted to the first reactive force receiving member 40 through the second reactive force receiving member 41 and the drive shaft 46a of the actuator 46, to be supported by the first reactive force receiving member 40 (see FIG. 6). As noted above, the first support mechanism 30 and second support mechanism 31 are separate from and independent of each other, and the second reactive force receiving member 41 and each pressure cylinder 3 contact each other through the spherical point of contact 12. Therefore, the head mounting post 32 is never bent in the Y-direction by the above reactive force.

On the other hand, when the heads 1 have uneven pressing forces in time of chip press-fitting, the pressure cylinders 3 also receive uneven reactive forces. Consequently, a reactive force acts between the pressure cylinders 3 to cause a bending in the X-direction. Since the pressure cylinders 3 are movable up and down, said reactive force acts on the second reactive force receiving member 41. The second reactive force receiving member 41 undergoing this reactive force bends in the X-direction as shown in FIG. 5. Since the second reactive force receiving member 41 and lift member 33 are connected by point contact, a bending moment does not act on this connecting portion. Each pressure cylinder 3 is movable up and down relative to the lift member 33, and the second reactive force receiving member 41 and each pressure cylinder 3 contact each other through the spherical point of contact 12. Even though the second reactive force receiving member 41 may bend in the X-direction, a bending moment does not act on each pressure cylinder 3. Thus, the lift member 33 never bends in the X-direction.

According to the apparatus in this embodiment, as described above, in the chip bonding apparatus of the multi-head type, a deviation or error in parallelism never occurs between the heads 1 and table 6. A plurality of chips may be press-fitted on the substrates simultaneously and accurately.

The present invention is not limited to the ACF technique, but is applicable to various flip chip techniques. That is, in a flip chip technique for installing chips directly on substrates, bumps of the chips (electrodes) are press-fitted on electrode tips on the substrates. This requires a parallelism in the order of several micrometers over a total range of the chip. The present technique is effective, in which the heads are free from a moment and no error occurs in parallelism.

Industrial Utility

As described above, the present invention is useful for a flip chip technique for press-fitting chips on substrates, since no deviation or error in parallelism occurs between a head holding a chip and a table holding a substrate.

What is claimed is:

1. A chip bonding apparatus for press-fitting a chip on a substrate, characterized by comprising a head for holding the chip, a pressure cylinder for pressing said head toward the substrate, a first support mechanism for supporting said pressure cylinder to be movable up and down, and a second support mechanism separate from and independent of said first support mechanism for supporting a reactive force acting on said pressure cylinder when said head is pressed toward the substrate.

2. A chip bonding apparatus as defined in claim 1, wherein said second support mechanism supports the reactive force acting on said pressure cylinder, by contacting said pressure cylinder.

3. A chip bonding apparatus as defined in claim 2, wherein said second support mechanism contacts said pressure cylinder by point contact.

4. A chip bonding apparatus as defined in claim 3, wherein said second support mechanism contacts said pressure cylinder through a spherical point of contact.

5. A chip bonding apparatus as defined in claim 1, wherein said first support mechanism includes a fixed head mounting post, a guide rail disposed to extend vertically on this head mounting post, and a movable member slidably engaged with this guide rail and connected to said pressure cylinder.

6. A chip bonding apparatus as defined in claim 1, wherein said second support mechanism includes a fixed frame, and a reactive force receiving member connected to this frame, this reactive force receiving member contacting said pressure cylinder to support the reactive force acting on said pressure cylinder.

7. A chip bonding apparatus as defined in claim 1, comprising plural sets of said head and said pressure cylinder.

8. A chip bonding apparatus as defined in claim 7, wherein:

said first support mechanism supports each said pressure cylinder to be movable up and down; and said second support mechanism is separate from and independent of said first support mechanism for supporting a reactive force acting on each said pressure cylinder when each said head is pressed toward the substrate.

9. A chip bonding apparatus as defined in claim 8, wherein:

said first support mechanism includes a fixed head mounting post, and a lift member vertically movably attached to this head mounting post for supporting each pressure cylinder to be movable up and down; and drive means is provided for vertically moving said lift member with each pressure cylinder.

10. A chip bonding apparatus as defined in claim 9, wherein said second support mechanism includes a fixed frame, a first reactive force receiving member connected to this frame, and a second reactive force receiving member vertically movably supported by this first reactive force receiving member, connected to said lift member by point contact or line contact, and contacting each pressure cylinder disposed on said lift member, and wherein drive means of said lift member is attached to said first reactive force receiving member, this drive means having a drive shaft connected to said second reactive force receiving member.

* * * * *